United States Patent [19]

Seger

[11] Patent Number: 5,119,016
[45] Date of Patent: Jun. 2, 1992

[54] CLAMP LIMITER CIRCUIT WITH PRECISE CLAMPING LEVEL CONTROL

[75] Inventor: Andrew J. Seger, Hackettstown, N.J.

[73] Assignee: AT&T Bell Laboratories, Murray Hill, N.J.

[21] Appl. No.: 677,212

[22] Filed: Mar. 29, 1991

[51] Int. Cl.⁵ ................................................ G05F 3/16
[52] U.S. Cl. ...................... 323/314; 307/542; 307/547; 307/555
[58] Field of Search ............. 323/313, 314; 307/540, 307/542, 544, 549, 547, 567, 555

[56] References Cited

U.S. PATENT DOCUMENTS

| | | | |
|---|---|---|---|
| 3,564,298 | 2/1971 | Colino | 302/542 |
| 3,851,525 | 12/1974 | Nichols et al. | 374/178 |
| 4,422,033 | 12/1983 | Minner et al. | 323/314 |
| 4,628,248 | 12/1986 | Birittella et al. | 323/314 |
| 4,663,542 | 5/1987 | Buck et al. | 307/308 |
| 4,665,547 | 5/1987 | Tuhy et al. | 307/567 |
| 4,750,061 | 6/1988 | Kawasaki | 360/66 |
| 4,864,155 | 9/1989 | Schmitt | 307/112 |
| 4,879,506 | 11/1989 | Braun | 323/314 |
| 4,882,504 | 12/1989 | Petitjean et al. | 307/256 |
| 4,890,015 | 12/1989 | Wise | 307/542 |
| 4,908,526 | 3/1990 | Mefford | 307/555 |
| 5,015,880 | 5/1991 | Drake et al. | 307/443 |

Primary Examiner—Steven L. Stephan
Assistant Examiner—Ben Davidson
Attorney, Agent, or Firm—C. E. Graves

[57] ABSTRACT

A limiter/clamp circuit is described having a sharp bend in the clamp characteristic and a transition from its linear range to its clamp range that occurs over a desirably small voltage range. The sharp bend is achieved by a feedback loop consisting of plural transistor elements configured in a current "mirror" feedback structure. This circuit is based on achieving an exponential-/logarithmic dependence of the voltages and currents in the feedback loop, which serve to control the feedback signal to the base of a 2-transistor clamping device. The circuitry also provides relatively symmetric clamping.

4 Claims, 2 Drawing Sheets

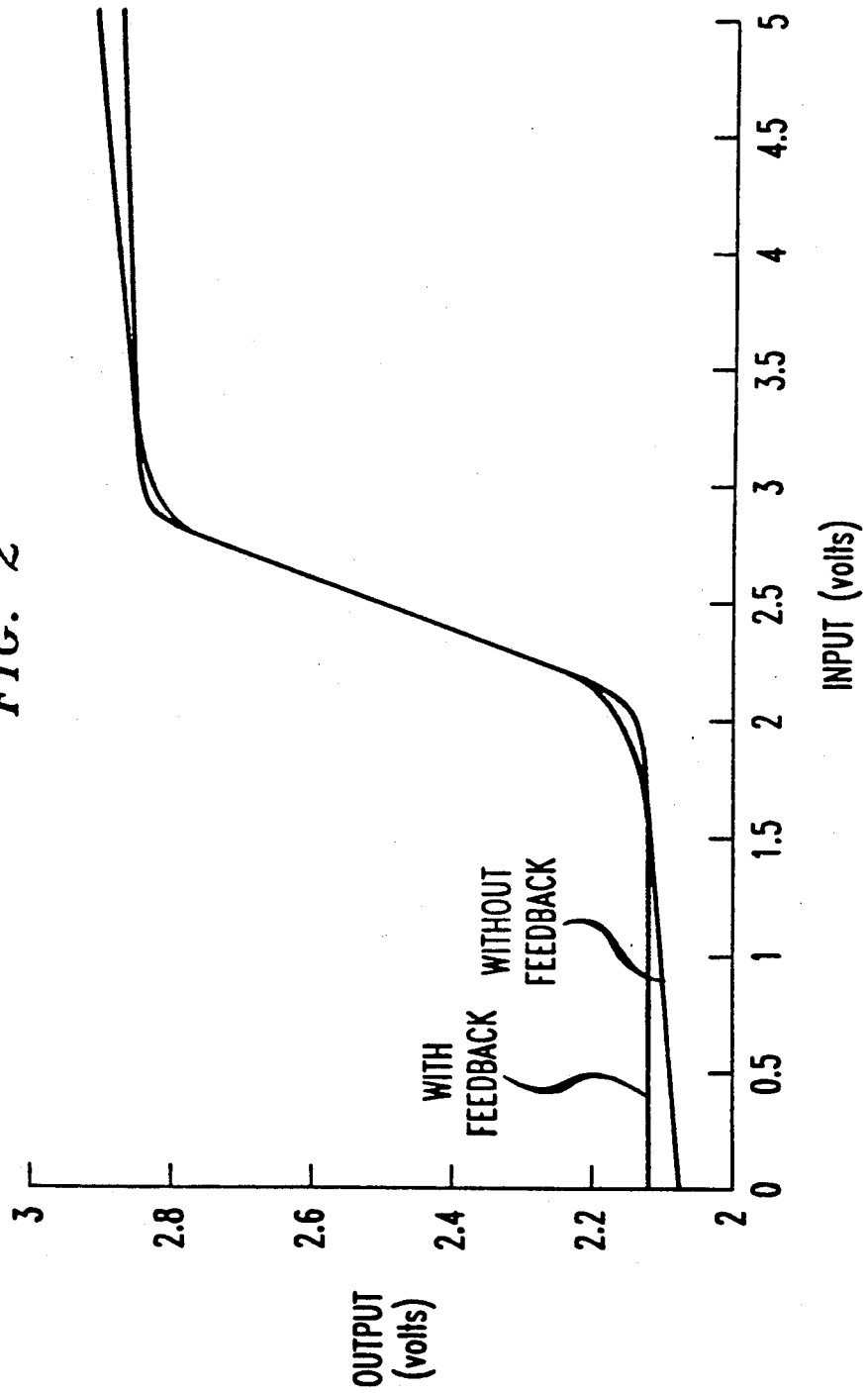

CLAMP LIMITER CIRCUIT WITH PRECISE CLAMPING LEVEL CONTROL

The government has rights in this invention pursuant to Contract No. N00039-90-C-0077 awarded by the Department of the Navy.

FIELD OF THE INVENTION

This invention relates to voltage clamp circuits and, more particularly, to clamp or limiter circuits which provide very precise control of clamping levels and characteristics.

BACKGROUND OF THE INVENTION

One standard limiter circuit of the prior art is a simple circuit of two parallel diodes which clamp a signal when the signal becomes high enough to turn either one of the diodes on. An example of this structure is found in *Operational Amplifiers and Linear Integrated Circuits*, page 285 (Prentice-Hall 1977).

Another limiter circuit uses a bridge structure for which the clamp level threshold is set by biases on diodes.

These and other known limiter/clamp circuits typically do not solve certain problems that arise occasionally in commercial telecommunications, high definition television and in other arts which utilize FM transmission technology and, therefore, require limiter/clamp functions.

For example, it often is necessary to provide a clamp circuit that clamps at a lower voltage, such as 0.4 volts; whereas typical standard clamp circuits operate, for example, between 0.7 and 0.8 volts and the clamp characteristic follows that of a diode.

It also is useful to maintain symmetric clamp characteristics. This is needed in applications where timing information is extracted from zero crossings (where a voltage changes from negative to positive); and is desirable in other situations because the related circuitry would be less complex. For instance, in a situation where the harmonics generated from the normal limiting action of this type of circuit must be filtered out, the required filter would be less complex because the first overtone to eliminate would be the third harmonic, rather than the second which results from asymmetric performance.

Other performance characteristics occasionally necessary in limiter/clamp circuits, but which are not present in a working combination in available limiter/clamp circuits, include obtaining an absolute clamp level and maintaining linear performance for normal input levels. Prior art circuitry does not provide separate control of the linear range and clamp level. Typically, the clamp level is trimmed-in and the resulting linear range performance is simply accepted. Prior art usually produces harmonic distortion products even for low-level signals.

SUMMARY OF THE INVENTION

This invention is a limiter/clamp circuit having a sharp bend in the clamp characteristic so that the transition from the linear range to the clamp range occurs over a small voltage range without any discontinuity in the input/output performance characteristics.

The sharp bend is achieved in accordance with the invention, by a control circuitry feedback loop created by a plurality of transistor elements which are configured in a current "mirror" feedback structure. The operation of this circuit is based on an exponential/logarithmic dependence of the voltages and current in the feedback loop that serves to control the feedback signal to the base of a 2-transistor clamping device. One transistor operates on each polarity.

The overall effect of the feedback circuit as it operates in the overall inventive configuration, essentially is to sharpen the "bend" in the clamp characteristic, which achieves clamping at a desirably low voltage, along with a highly symmetric clamp characteristic. An absolute clamp level is also advantageously achieved, while highly linear performance for normal input levels in the range of 0.25 volts peak is also maintained.

The invention and its further objects, features and advantages will be more fully appreciated from a reading of the description to follow of an illustrative embodiment and from the drawing.

DESCRIPTION OF THE DRAWING

FIG. 2 is a graph illustrating the advantages of the invention.

DETAILED DESCRIPTION

Figure 1:
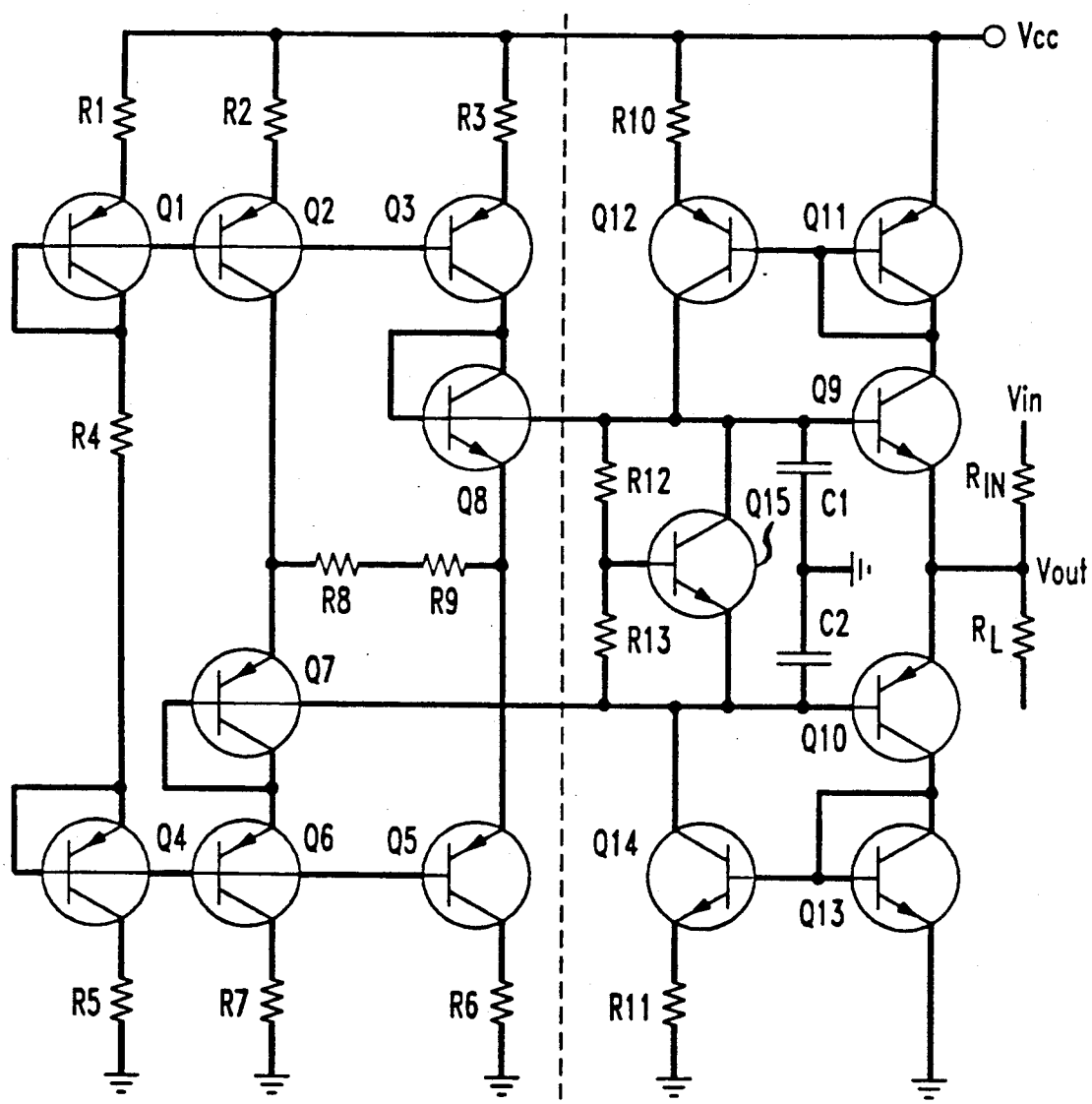
FIG. 1 is a circuit diagram illustrating the invention.
Figure 1:
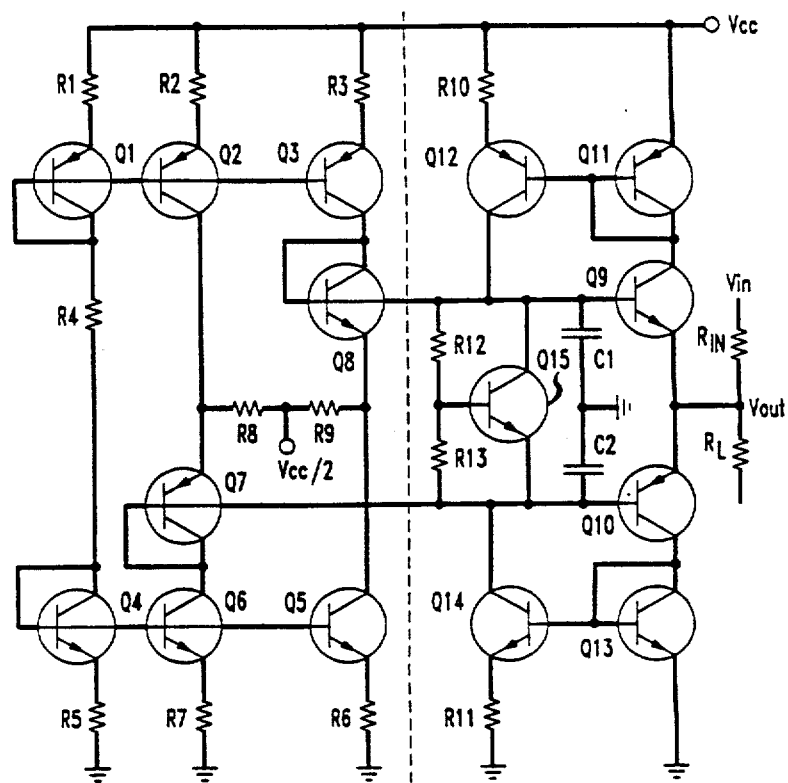

FIG. 1 is a circuit illustrating the invention. Looking first to the components to the left of the dashed line, transistors Q1–Q6 are a conventional transistor biasing network, which establish fixed current levels through resistors R8 and R9 and set the linear range of the limiter/clamp circuit. Increasing the resistance of R8 and R9 lowers the voltage level where the onset of clamping beings. In operation, the limiting transistors Q9 and Q10 are turned slightly "on". Transistors Q7 and Q8, while shown to the left of the dashed line, are part of the limiter circuit which will now be described.

The portion of the circuit which effects the clamping is to the right of the dashed line. The clamping node is denoted "$V_{out}$" in FIG. 1; the node is connected to the input by resistor "$R_{in}$," and the load resistor "$R_L$." $V_{in}$ represents an AC signal source that is DC-biased at a level of about $\frac{1}{2} V_{cc}$. $R_L$ is biased at a level of $\frac{1}{2} V_{cc}$ in order to center the output node at a level of $\frac{1}{2} V_{cc}$ for class A operation.

The circuit of FIG. 1 operates in a linear range and in a non-linear range. This is seen in the plot denoted "with feedback" in FIG. 2. Transistors Q9 and Q10 in the linear range are in a high impedance off-state, being biased at about half the required voltage needed to turn them on. As the input voltage $V_{in}$ swings negative with respect to mid-supply, transistor Q9 begins to conduct. The collector current of transistor Q9, in accordance with one aspect of the invention, is "mirrored" through transistor Q11 to transistor Q12. This causes the collector of transistor Q12 to rise, thus pulling up the base of transistor Q9 and forcing it to turn on even harder. In response, current is sourced into the output node labeled $V_{out}$, preventing it from going further negative as the input voltage continues to go further negative. In this fashion, the signal present on the output node is clamped.

For positive input voltage swings, the operation involves Q10, Q13, and Q14 in the same fashion as above except that the base of Q10 is pulled down forcing it to turn on harder. This in turn sinks current from the output node preventing it from going further positive as the input voltage continues to go further positive.

The component values for the circuit illustrated in FIG. 1 are: R1, 12K; R2, 4K; R3, 12K; R4, 400K; R5, 12K; R6, 4K; R7, 12K; R8, 12K; R9, 12K; R10, 6K; R11, 6K; R12, 100K; R13, 100K; C1, 10p; and C2, 10p.

Practitioners in the art of clamping circuits might at first identify the operative mechanism as positive feedback. Upon analysis of the gain and phase relationships, however, a different conclusion emerges. In the illustration, the emitter area of transistor Q11 is selected to be six times larger than the emitter area of transistor Q12; and, therefore, Q12 never fully turns on. Accordingly, only a fraction of the current in transistor Q11 is actually "mirrored" around the loop. In other words, loop-gain is less than unity. In addition, further degeneration of this feedback signal is obtained from the emitter resistor R10.

A close control must be realized over the feedback signal to the base of the clamping devices, transistors Q9 and Q10. This control is effected, in accordance with another aspect of the invention, by providing an exponential/logarithmic dependence of the voltage and currents in the abovedescribed feedback loop. Specifically, the collector current of transistor Q9 is exponentially related to the voltage across its base-emitter junction. A linear increase in the base-emitter voltage of transistor Q9 due to the input voltage gives rise to an exponential collector current.

This exponential collector current in turn causes a linear increase in base-emitter of transistor Q11, which is split across the base-emitter junction of transistor Q12, and resistor R10. The portion of this voltage across the resistor R10 causes a current value equal to $(V_{be11}-V_{be12})/R10$ to flow through the collector of transistor Q12. This last-named current drives into load resistor R12, which causes the voltage on the base of transistor Q9 to increase in a quasi-linear fashion, relative to the input $V_{in}$. The increase in the base voltage of transistor Q9 causes it to turn on harder, resulting in a sharper clamp characteristic than would otherwise be obtained without feedback. The improved clamp characteristic is shown in the "with feedback" trace in FIG. 2.

The bottom half of the inventive circuit, consisting of transistors Q10, Q13, and Q14, and resistor R11, performs the same function as described above for positive-going signals on the output node $V_{out}$. The overall effect of this feedback is to substantially sharpen the transition band in the clamp characteristics. This result is shown in FIG. 2, which also demonstrates the performance of a typical prior art limiter circuit without the feedback innovation of the present invention.

The DC reference voltage present at the junction of resistors R8 and R9 is derived from the same voltage source as the DC voltage on $V_{in}$, and at the bottom of R1. Therefore the clamping devices are always biased at the same DC level relative to the external circuit that the limiter is operating on at the junction of resistors R8 and R9. Put another way, the circuit of the present invention "self-centers." Because of this self-centering, the circuit operates as required to realize the objects of the invention over a wide range of DC bias voltages. The purpose of capacitors C1 and C2 is to roll off or band-limit the frequency response to provide additional gain phase margin. The elements R12, R13, and transistor Q15 provide temperature compensation.

The concept of the invention, embodied in the current "mirror" feedback structure described above, might be termed an "inverse Widlar" current source. In a Widlar current source, described, for example, in *Analog Integrated Circuit Design* by Grey and Meyer, the resistor is placed in the emitter of the larger transistor. The application of a Widlar current source is to generate a scaled current relative to a reference current. In contrast, in the present invention, the resistor R10 is in the emitter leg of the smaller transistor Q12, instead of being in the emitter leg of transistor Q11 which in the example is six times larger than Q11 in emitter junction area. This serves to lower the current "mirrored" around the loop, and also to keep the loop gain to less than unity providing the close control of the feedback current.

The circuit may be realized as part of an integrated circuit on the same chip as parent circuits which required a limiter. It is particularly useful in applications where precise control of a signal is required under adverse conditions such as uncontrolled inputs which may cause spurious signals.

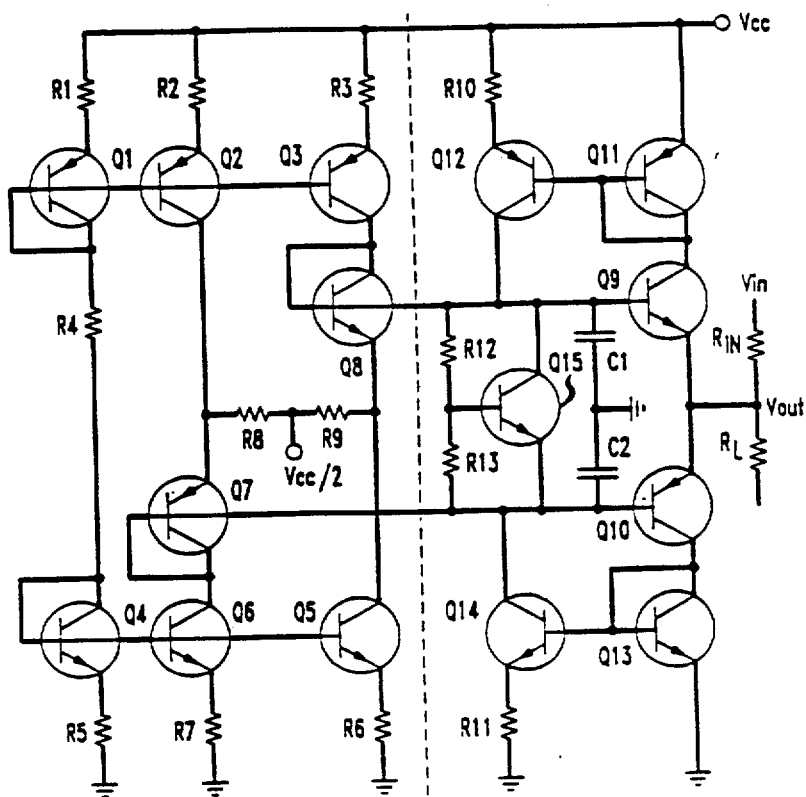

I claim:

1. A limiter/clamp circuit having a linear range and a clamp range, and a transition range between said linear and clamp range, comprising:
   a sense/clamp node ($V_{out}$);
   a first transistor clamping device (Q9) and a second transistor clamping device (Q10) connected emitter-to-emitter at said sense/clamp node;
   a diode-connected third transistor (Q11) and a fourth transistor (Q12) connected base-to-base;
   a first feedback degeneration resistor (R10) connected to the emitter of said third transistor;
   the collectors of said first (Q9) and said third (Q11) transistors being connected;
   the base of said first transistor (Q9) being connected to the collector of said fourth transistor (Q13);
   means for biasing said first (Q9) and said second (Q10) transistors to a high impedance "off" state to initially maintain said limiter/clamp circuit in said linear range, at about half the voltage needed to turn said two transistors on;
   an increasing AC signal voltage with negative polarity introduced through an external resistor present on said sense/clamp node causing said first transistor (Q9) to being to conduct, causing the collector of said fourth transistor (Q12) to rise and increasingly turn on the base of said first transistor (Q9);
   the resultant rise in base current of said first transistor (Q9) producing higher collector current in said first transistor (Q9) which is soured into said sense/clamp node ($V_{out}$) preventing said node from going further negative, whereby said signal in said sense/clamp node is clamped.

2. The circuit of claim 1, further comprising:
   a diode connected fifth transistor (Q13) and a sixth transistor (Q14) connected base-to-base;
   the collectors of said second (Q10) and said fifth (Q13) transistors being connected;
   the base of said second transistor (Q10) being connected to the collector of said sixth transistor (Q14);
   a second feedback degeneration resistor (R11) connected to the emitter of said sixth transistor (Q14);
   an increasing AC signal voltage with positive polarity introduced through an external resistor present on said sense/clamp node causing said second transistor (Q10) to begin to conduct, causing the collector of said fifth transistor (Q13) to fall and increasingly turn on said base of said second transistor (Q10); and the resultant increase in base current of said second transistor (Q10) producing higher collector current in said second transistor (Q10) which is sinked out of said sense/clamp node ($V_{out}$) preventing said node form going further positive, whereby said signal on said sense/clamp node is clamped.

3. The circuit of claims 1 or 2 wherein said emitter area of said third (Q11) and fifth (Q13) transistors are substantially larger than the emitter of their base-connected counterparts fourth (Q12) and sixth (Q14) transistors to substantially prevent said fourth transistor (Q12) or said sixth transistor (Q14) from fully turning on.

4. The circuit of claim 3 further comprising means, including seventh transistor (Q15) connected base-to-base to both said first transistor (Q9) and said second transistor (Q10), a third resistor (R12) and a fourth resistor (R13) connected respectively in said base-to-base circuits, for effecting temperature compensation of said limiter clamp circuit to control the level at which clamping starts and the maximum clamp level.

* * * * *

UNITED STATES PATENT AND TRADEMARK OFFICE
CERTIFICATE OF CORRECTION

PATENT NO. : 5,119,016
DATED : June 2, 1992

INVENTOR(S) : A.J. Seger

It is certified that error appears in the above-identified patent and that said Letters Patent is hereby corrected as shown below:

The title page should be deleted to appear as per attached title page.

In the drawings, sheet 1 consisting of Fig. 1, should be deleted to be replaced with the corrected Fig. 1, as shown on the attached title page.

Signed and Sealed this

Eleventh Day of January, 1994

*Attest:*

BRUCE LEHMAN

*Attesting Officer*     *Commissioner of Patents and Trademarks*

United States Patent [19]

Seger

[11] Patent Number: 5,119,016
[45] Date of Patent: Jun. 2, 1992

[54] CLAMP LIMITER CIRCUIT WITH PRECISE CLAMPING LEVEL CONTROL

[75] Inventor: Andrew J. Seger, Hackettstown, N.J.

[73] Assignee: AT&T Bell Laboratories, Murray Hill, N.J.

[21] Appl. No.: 677,212

[22] Filed: Mar. 29, 1991

[51] Int. Cl.⁵ .............................................. G05F 3/16
[52] U.S. Cl. ................................ 323/314; 307/542; 307/547; 307/555
[58] Field of Search ............... 323/313, 314; 307/540, 307/542, 544, 549, 547, 567, 555

[56] References Cited

U.S. PATENT DOCUMENTS

| | | | |
|---|---|---|---|
| 3,564,298 | 2/1971 | Colino | 307/542 |
| 3,851,525 | 12/1974 | Nichols et al. | 374/178 |
| 4,422,033 | 12/1983 | Minner et al. | 323/314 |
| 4,628,248 | 12/1986 | Birittella et al. | 323/314 |
| 4,663,542 | 5/1987 | Buck et al. | 307/308 |
| 4,665,547 | 5/1987 | Tuhy et al. | 307/567 |
| 4,750,061 | 6/1988 | Kawasaki | 360/66 |
| 4,864,155 | 9/1989 | Schmitt | 307/112 |
| 4,879,506 | 11/1989 | Braun | 323/314 |
| 4,882,504 | 12/1989 | Petitjean et al. | 307/256 |
| 4,890,015 | 12/1989 | Wise | 307/542 |
| 4,908,526 | 3/1990 | Mefford | 307/555 |
| 5,015,880 | 5/1991 | Drake et al. | 307/443 |

*Primary Examiner*—Steven L. Stephan
*Assistant Examiner*—Ben Davidson
*Attorney, Agent, or Firm*—C. E. Graves

[57] ABSTRACT

A limiter/clamp circuit is described having a sharp bend in the clamp characteristic and a transition from its linear range to its clamp range that occurs over a desirably small voltage range. The sharp bend is achieved by a feedback loop consisting of plural transistor elements configured in a current "mirror" feedback structure. This circuit is based on achieving an exponential/logarithmic dependence of the voltages and currents in the feedback loop, which serve to control the feedback signal to the base of a 2-transistor clamping device. The circuitry also provides relatively symmetric clamping.

4 Claims, 2 Drawing Sheets